United States Patent
Ong et al.

(10) Patent No.: US 12,412,784 B2
(45) Date of Patent: Sep. 9, 2025

(54) RECESSED VERTICAL INTERCONNECTS FOR DEVICE MINIATURIZATION

(71) Applicant: Intel Corporation, Santa Clara, CA (US)

(72) Inventors: Yee Lun Ong, Penang (MY); Teong Guan Yew, Pulau Pinang (MY); Bok Eng Cheah, Pulau Pinang (MY); Jackson Chung Peng Kong, Pulau Pinang (MY)

(73) Assignee: Intel Corporation, Santa Clara, CA (US)

( * ) Notice: Subject to any disclaimer, the term of this patent is extended or adjusted under 35 U.S.C. 154(b) by 821 days.

(21) Appl. No.: 17/498,008

(22) Filed: Oct. 11, 2021

(65) Prior Publication Data
US 2023/0112520 A1    Apr. 13, 2023

(51) Int. Cl.
*H01L 21/768* (2006.01)
*H01L 23/522* (2006.01)
*H01L 23/528* (2006.01)

(52) U.S. Cl.
CPC .. *H01L 21/76897* (2013.01); *H01L 21/76816* (2013.01); *H01L 21/76885* (2013.01); *H01L 23/5226* (2013.01); *H01L 23/528* (2013.01)

(58) Field of Classification Search
CPC ......... H01L 21/76897; H01L 21/76816; H01L 21/76885; H01L 21/486; H01L 23/5226; H01L 23/528; H01L 23/49822; H01L 23/499827; H05K 1/0298; H05K 1/0245; H05K 1/116
See application file for complete search history.

(56) References Cited

U.S. PATENT DOCUMENTS

| | | | |
|---|---|---|---|
| 5,784,262 A * | 7/1998 | Sherman | H05K 3/3436 361/767 |
| 5,875,102 A * | 2/1999 | Barrow | H01L 23/49816 174/265 |
| 10,510,633 B1* | 12/2019 | Tsao | H01L 23/142 |
| 2006/0083895 A1* | 4/2006 | Ikeda | B32B 3/10 257/E23.079 |
| 2013/0193584 A1* | 8/2013 | Ding | H01L 23/481 257/774 |
| 2014/0374150 A1* | 12/2014 | Inagaki | H05K 1/113 427/97.1 |
| 2020/0013706 A1* | 1/2020 | Kang | H01L 23/49838 |

* cited by examiner

*Primary Examiner* — Galina G Yushina
(74) *Attorney, Agent, or Firm* — Viering, Jentschura & Partner mbB

(57) ABSTRACT

The present disclosure relates to an electronic assembly including a package substrate with a first surface and an opposing second surface; a first interconnect disposed in the package substrate and extending between the first and the second surfaces; and a second interconnect disposed in the package substrate and extending between the first and the second surfaces; wherein the first interconnect comprises a first recessed side wall and the second interconnect is arranged adjacent the first recessed side wall.

16 Claims, 16 Drawing Sheets

(i) Conventional PTH (ii) Recessed PTH (Ø=10mils)

(iii) Recessed PTH (Ø=12mils)

RECESSED VERTICAL INTERCONNECTS FOR DEVICE MINIATURIZATION

BACKGROUND

Current solutions to address package and/or platform miniaturization through vertical interconnects scaling include reduced plated through hole (PTH) drill size, e.g., drill bit diameter reduction from 10 mils to 6 mils, and/or improved mechanical registration accuracy between vertical interconnects and contact pads from 4 mils to 2.5 mils through improved imaging process.

Large PTH interconnects pitch geometry (i.e., distance between centers of two adjacent PTH interconnects) impacts the package and/or printed circuit board routing density and flexibility, thus inhibiting device miniaturization.

The disadvantages of the above-mentioned solutions include manufacturing costs trade-off, i.e., increased frequency of mechanical drill bit replacement with reduced bit diameter and increased assembly yield losses due to more stringent screening of parts meeting the desired mechanical registration specifications.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1A:
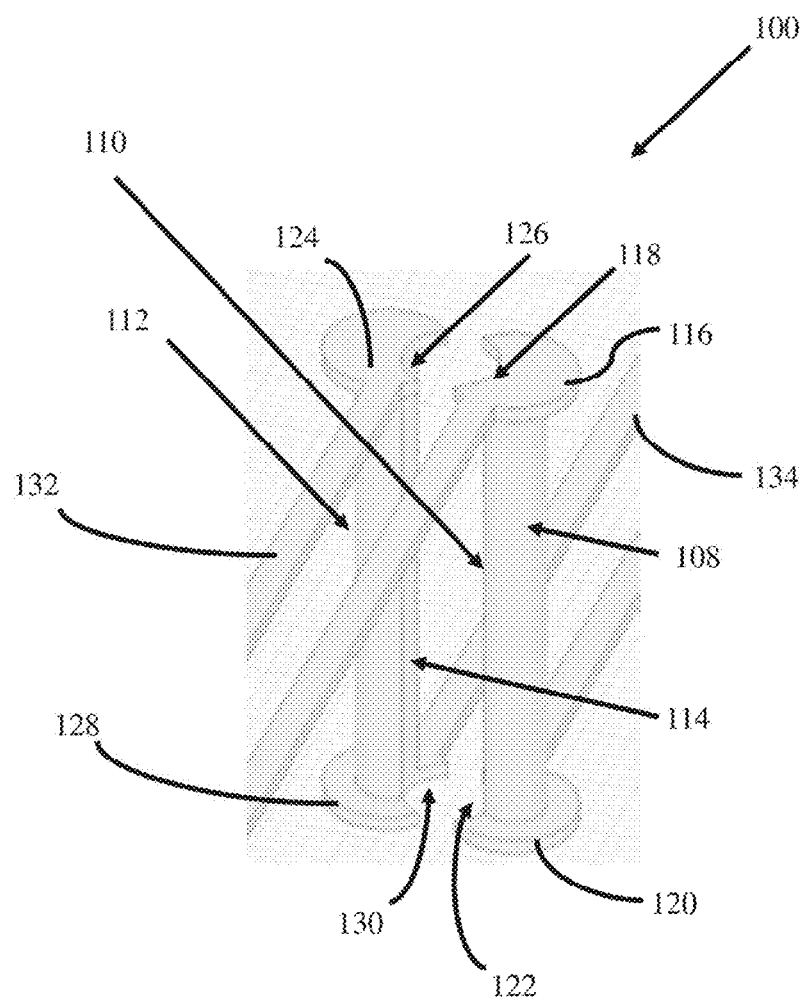
FIG. 1A shows a perspective view of an electronic assembly including recessed vertical interconnects for improved electrical performance and device miniaturization according to an aspect of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects may be combined with one or more other aspects to form new aspects.

This present disclosure addresses the package and/or printed circuit board real-estate miniaturization due to the limitation of existing vertical interconnects, e.g., plated through hole (PTH) interconnects pitch scaling.

The present disclosure generally relates to an electronic assembly. The electronic assembly may include a package substrate with a first surface and an opposing second surface. The electronic assembly may include a first interconnect in the package substrate and the first interconnect may extend between the first and the second surfaces. The electronic assembly may include a second interconnect in the package substrate and the second interconnect may extend between the first and the second surfaces. The first interconnect may include a first recessed side wall and the second interconnect may be arranged adjacent the first recessed side wall.

In various aspects, the first interconnect, the second interconnect, or both, may extend between the first (e.g., top) and the second (e.g., bottom) surfaces of the package substrate to form vertical interconnects.

The first interconnect may include a side wall that may extend along a length (partially or fully) thereof. The first recessed side wall may include a receding portion that cuts inwards. The receding portion may extend along a length (partially or fully) of the side wall. In various aspects, the first interconnect may include a receding portion having a cross section in a crescent and/or gibbous shape. Other shapes may also be possible.

In various aspects, the electronic assembly may further include a first contact pad including a first recessed side coupled to a first terminal of the first interconnect. The electronic assembly may also include a subsequent first contact pad including a subsequent first recessed side coupled to an opposing second terminal of the first interconnect. The first and the subsequent first recessed sides may be aligned with the first recessed side wall.

The first recessed side of the first contact pad may include a receding portion that cuts inwards. In various aspects, the first contact pad may include a receding portion having a cross section in a crescent and/or gibbous shape. Other shapes may also be possible. Conveniently though not necessarily, the first recessed side wall and the first recessed side may both have the same shape, e.g., a crescent shape. The same discussion may also apply to the subsequent first recessed side of the subsequent first contact pad.

In various aspects, the second interconnect may be at least partially encircled by the first recessed side wall.

In various aspects, the second interconnect may further include a second recessed side wall extending in parallel with the first recessed side wall between the first and the second surfaces.

In various aspects, the second interconnect may include a side wall that may extend along a length (partially or fully) thereof. The second recessed side wall may include a receding portion that cuts inwards. The receding portion may extend along a length (partially or fully) of the side wall. In various aspects, the second interconnect may include a receding portion having a cross section in a crescent and/or gibbous shape. Other shapes may also be possible. In other aspects, the second interconnect may not include a recessed side wall.

In various aspects, the first and the second recessed sides may face each other.

In various aspects, the electronic assembly may further include a second contact pad including a second recessed side coupled to a first terminal of the second interconnect. The electronic assembly may include a subsequent second contact pad including a subsequent second recessed side coupled to an opposing second terminal of the second interconnect. The second and the subsequent second recessed sides may be aligned with the second recessed side wall.

The second recessed side of the second contact pad may include a receding portion that cuts inwards. In various aspects, the second contact pad may include a receding portion having a cross section in a crescent and/or gibbous shape. Other shapes may also be possible. Conveniently though not necessarily, the second recessed side wall and the second recessed side may both have the same shape, e.g., a crescent shape. The same discussion may also apply to the subsequent second recessed side of the subsequent second contact pad. In other aspects, the second contact pad, the subsequent second contact pad, or both, may not include a recessed side.

In various aspects, the electronic assembly may further include a plurality of first metal traces or planes coupled to the first and the second contact pads, and further include a plurality of second metal traces or planes coupled to the subsequent first and the subsequent second contact pads.

In various aspects, the electronic assembly may further include one or more devices coupled to the first and the second interconnects at the first surface.

In various aspects, the one or more devices may include one or more semiconductor dies and/or packages, e.g., a central processing unit (CPU), a graphic processing unit (GPU), a memory controller, a field programmable gate array (FPGA), a neural network accelerator, a communication device e.g., RFIC or a platform controller hub or chipset.

In various aspects, the first and second interconnects may be configured to facilitate a differential pair electrical signal.

In various aspects, the first interconnect may be configured to facilitate a reference voltage and the second interconnect may be configured to facilitate a single-ended electrical signal.

The present disclosure also generally relates to a computing device. The computing device may include a communication chip and an electronic assembly coupled to the communication chip. The electronic assembly may include a package substrate with a first surface and an opposing second surface. The electronic assembly may include a first interconnect in the package substrate and the first interconnect may extend between the first and the second surfaces. The electronic assembly may include a second interconnect in the package substrate and the second interconnect may extend between the first and the second surfaces. The first interconnect may include a first recessed side wall and the second interconnect may be arranged adjacent the first recessed side wall.

The present disclosure further generally relates to a method. The method may include providing a package substrate with a first surface and an opposing second surface. The method may include arranging a first interconnect in the package substrate, the first interconnect extending between the first and the second surfaces, wherein the first interconnect may include a first recessed side wall. The method may include arranging a second interconnect adjacent the first recessed side wall in the package substrate, the second interconnect extending between the first and the second surfaces.

The technical advantages of the present disclosure may include but are not limited to:

Device (package and/or printed circuit board) miniaturization through reduced PTH vertical interconnects pitch geometry; >20% package and/or board real-estate savings and/or z-height reduction (e.g., through reduced signal redistribution layers) achievable through improved routing density.

Improved electrical (signal and/or power integrity) performance through tighter signal PTH to ground PTH coupling, i.e., improved signal current return path (for single-ended bus e.g., DDR memory interface) and tighter differential signal PTHs coupling, e.g., a universal serial bus (USB) interface, a peripheral component interconnect express (PCIe) interface or a high speed ethernet interface. Tighter power (Vcc) to ground (Vss) interconnect coupling reduces AC loop inductance for improved power supply delivery or power integrity.

To more readily understand and put into practical effect the present disclosure, particular aspects will now be described by way of examples and not limitations, and with reference to the drawings. For the sake of brevity, duplicate descriptions of features and properties may be omitted.

Figure 1B:
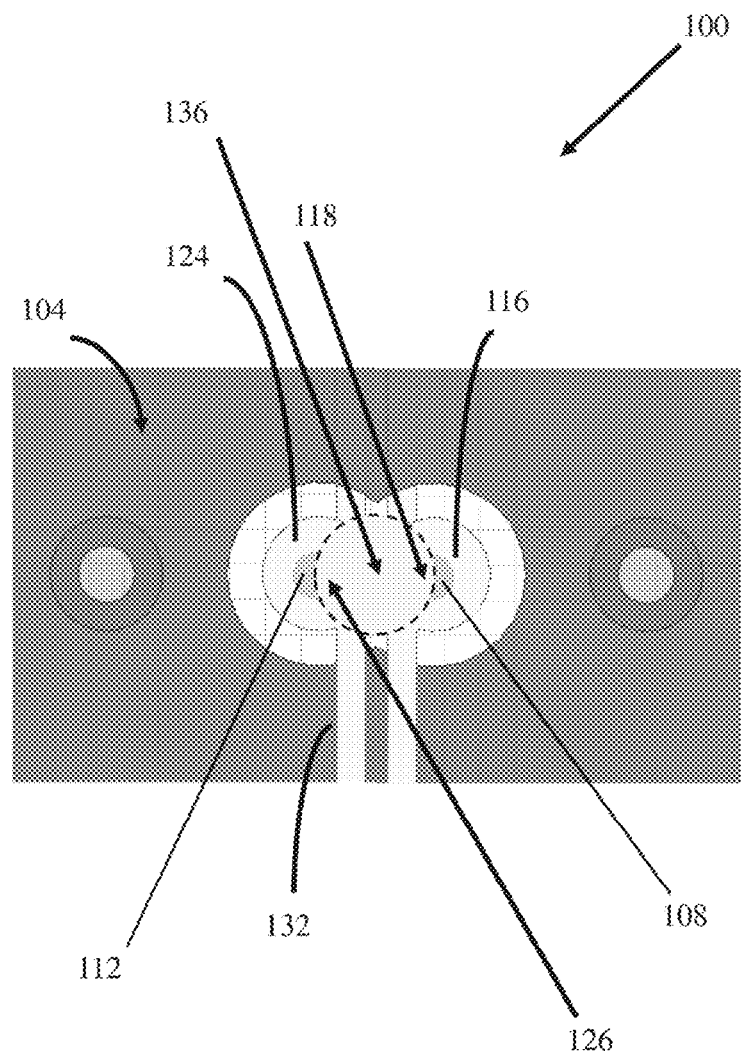
FIG. 1B shows a top view of the electronic assembly according to the aspect as shown in FIG. 1A.
Figure 1C:
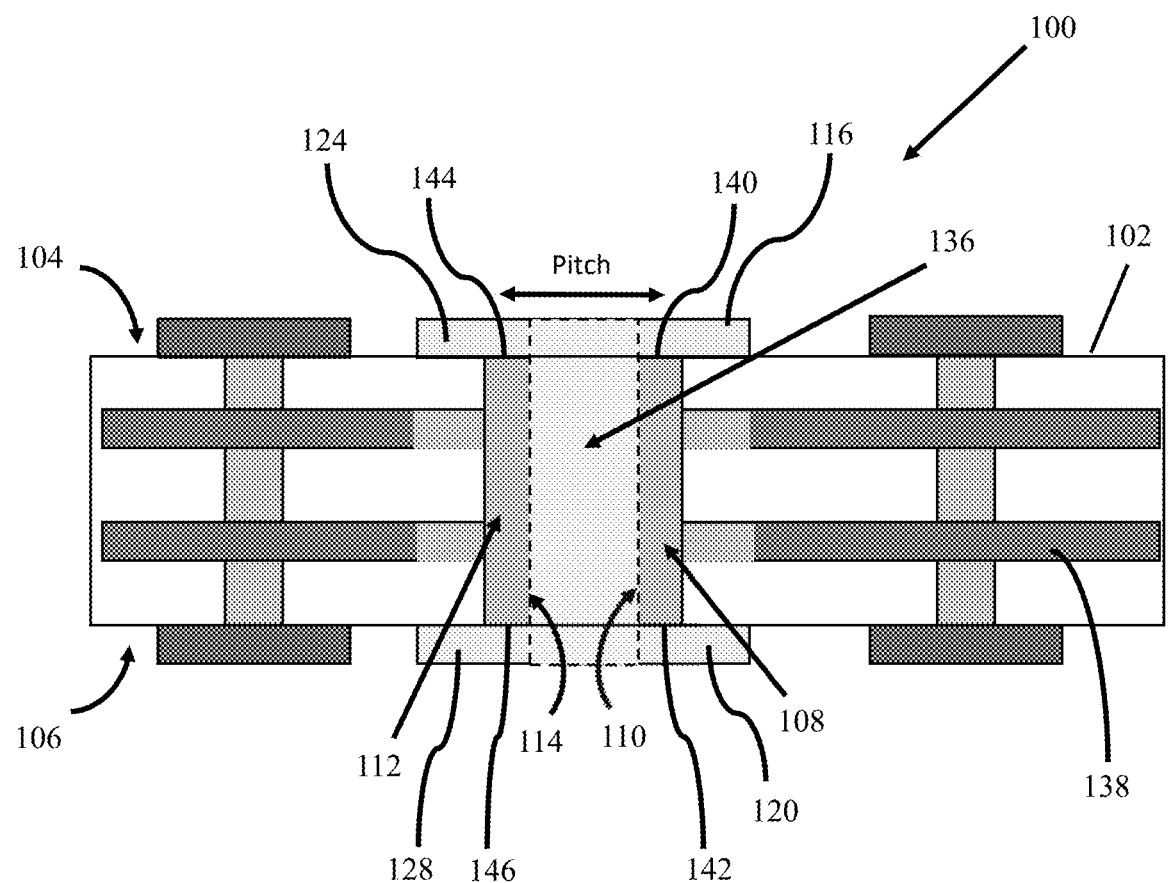
FIG. 1C shows a cross-sectional view of the electronic assembly according to the aspect as shown in FIG. 1A.

FIG. 1A shows a perspective view of recessed vertical interconnects 108, 112 in an electronic assembly 100 for improved electrical performance and device miniaturization according to an aspect of the present disclosure. FIG. 1B shows a top view of the electronic assembly 100 according to the aspect as shown in FIG. 1A. FIG. 1C shows a cross-sectional view of the electronic assembly 100 according to the aspect as shown in FIG. 1A.

In various aspects, the electronic assembly 100 may include a package substrate 102 having a first surface 104 and an opposing second surface 106. The first surface 104 may be a top surface of the package substrate 102. The second surface 106 may be a bottom surface of the package substrate 102. The first and second surfaces 104, 106 may be substantially horizontal when viewed from a cross-sectional viewpoint. The package substrate 102 may further include a plurality of metal planes 138 formed by metal layers embedded therein. In one aspect, the package substrate 102 may include two or more metal layers spaced apart by a dielectric layer. In one aspect, the package substrate 102 is a printed circuit board.

In various aspects, the package substrate 102 may include a first interconnect 108. The first interconnect 108 may include a first side wall 110 having a length that may extend between the first and second surfaces 104, 106 of the package substrate 102. In one aspect, the first interconnect 108 may extend vertically across the thickness of the package substrate 102. In other words, the first interconnect 108 may be perpendicular to the first and second surfaces 104, 106 to form a first vertical interconnect 108.

In various aspects, the first side wall 110 may include a recessed portion that may extend between the first and second surfaces 104, 106 of the package substrate 102 to form a first recessed side wall 110. In the aspect shown in FIG. 1A and FIG. 1B, the first recessed side wall 110 of the first interconnect 108 may have a crescent-shaped cross section.

In various aspects, the package substrate 102 may include a second interconnect 112. The second interconnect 112 may include a second side wall 114 having a length that may extend between the first and second surfaces 104, 106 of the package substrate 102. In one aspect, the second interconnect 112 may extend vertically across the thickness of the package substrate 102. In other words, the second interconnect 112 may be perpendicular to the first and second surfaces 104, 106 to form a second vertical interconnect 112.

In various aspects, the second side wall 114 may include a recessed portion that may extend between the first and second surfaces 104, 106 of the package substrate 102 to form a second recessed side wall 114. In the aspect shown in FIG. 1A and FIG. 1B, the second recessed side wall 114 of the second interconnect 112 may have a crescent-shaped cross section.

In one aspect, the second recessed side wall 114 may extend in parallel with the first recessed side wall 110 between the first and second surfaces 104, 106. In an aspect, the first recessed side wall 110 may be configured to face the second recessed side wall 114. In other words, the first interconnect 108 may be arranged adjacent or close to, but not contacting, the second interconnect 112. The arrangement may resemble a mirror image of the two interconnects 108, 112. The first and the second interconnects 108, 112 may be separated or kept apart by a recess opening 136 formed in the package substrate 102. The distance between the centers of the first and the second interconnects 108, 112 may be defined as a pitch.

In various aspects, the electronic assembly 100 may further include a first contact pad 116 arranged on the first surface 104 of the package substrate 102. The first contact pad 116 may include a first recessed side 118 coupled to a first terminal 140 of the first interconnect 108 at the first surface 104.

The first recessed side 118 of the first contact pad 116 may include a receding portion that cuts inwards. In various aspects, the first contact pad 116 may include a receding portion having a cross section in a crescent and/or gibbous shape. Other shapes may also be possible. Conveniently though not necessarily, the first recessed side wall 110 and the first recessed side 118 may both have the same shape, e.g., a crescent shape as shown in FIG. 1A and FIG. 1B.

In various aspects, the electronic assembly 100 may further include a subsequent first contact pad 120 arranged on the second surface 106 of the package substrate 102. The subsequent first contact pad 120 may include a subsequent first recessed side 122 coupled to an opposing second terminal 142 of the first interconnect 108 at the second surface 106.

The subsequent first recessed side 122 of the subsequent first contact pad 120 may include a receding portion that cuts inwards. In various aspects, the subsequent first contact pad 120 may include a receding portion having a cross section in a crescent and/or gibbous shape. Other shapes may also be possible. Conveniently though not necessarily, the first recessed side wall 110 and the subsequent first recessed side 122 may both have the same shape, e.g., a crescent shape as shown in FIG. 1A and FIG. 1B.

In one aspect, the first and the subsequent first recessed sides 118, 122 may be aligned with the first recessed side wall 110 of the first interconnect 108. In other words, the respective receding portion of the first recessed side 118 and the first recessed side wall 110 may coincide at the first surface 104 and the respective receding portion of the subsequent first recessed side 122 and the first recessed side wall 110 may coincide at the second surface 106.

In various aspects, the electronic assembly 100 may further include a second contact pad 124 arranged on the first surface 104 of the package substrate 102. The second contact pad 124 may include a second recessed side 126 coupled to a first terminal 144 of the second interconnect 112 at the first surface 104.

The second recessed side 126 of the second contact pad 124 may include a receding portion that cuts inwards. In various aspects, the second contact pad 124 may include a receding portion having a cross section in a crescent and/or gibbous shape. Other shapes may also be possible. Conveniently though not necessarily, the second recessed side wall 114 and the second recessed side 126 may both have the same shape, e.g., a crescent shape as shown in FIG. 1A and FIG. 1B.

In various aspects, the electronic assembly 100 may further include a subsequent second contact pad 128 arranged on the second surface 106 of the package substrate 102. The subsequent second contact pad 128 may include a subsequent second recessed side 130 coupled to an opposing second terminal 146 of the second interconnect 112 at the second surface 106.

The subsequent second recessed side 130 of the subsequent second contact pad 128 may include a receding portion that cuts inwards. In various aspects, the subsequent second contact pad 128 may include a receding portion having a cross section in a crescent and/or gibbous shape. Other shapes may also be possible. Conveniently though not necessarily, the second recessed side wall 114 and the subsequent second recessed side 130 may both have the same shape, e.g., a crescent shape as shown in FIG. 1A and FIG. 1B.

In one aspect, the second and the subsequent second recessed sides 126, 130 may be aligned with the second recessed side wall 114 of the second interconnect 112. In other words, the respective receding portion of the second recessed side 126 and the second recessed side wall 114 may coincide at the first surface 104 and the respective receding portion of the subsequent second recessed side 130 and the second recessed side wall 114 may coincide at the second surface 106.

In an aspect, the second recessed side 126 may be configured to face the first recessed side 118. In a further aspect, the subsequent second recessed side 130 may be configured to face the subsequent first recessed side 122.

In various aspects, the electronic assembly 100 may include a plurality of first metal traces and/or planes 132 coupled to the first and the second contact pads 116, 124. In further aspects, the electronic assembly 100 may also include a plurality of second metal traces and/or planes 134 coupled to the subsequent first and the subsequent second contact pads 120, 128.

Figure 1D:
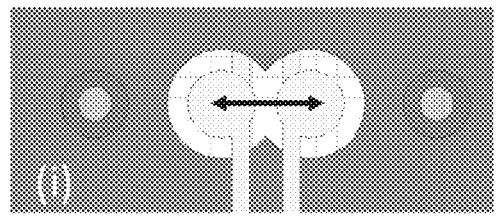
FIG. 1D shows PTH vertical interconnects of (i) a conventional design, and presently disclosed recessed design with (ii) a Recess Ø=10 mils and (iii) a Recess Ø=12 mils.
Figure 1D:
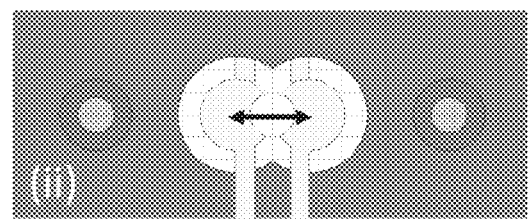
Figure 1D:
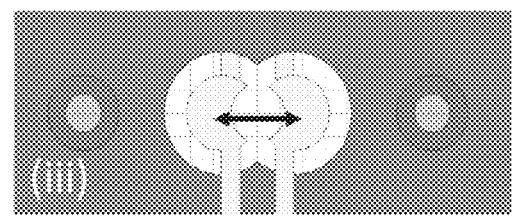

FIG. 1D shows PTH vertical interconnects of (i) a conventional design, and presently disclosed recessed design with (ii) a Recess Ø=10 mils and (iii) a Recess Ø=12 mils.

The conventional design (i) may include a pitch of 21 mils; the recessed designs of (ii) and (iii) may each include a pitch of 16 mils.

Figure 1E:
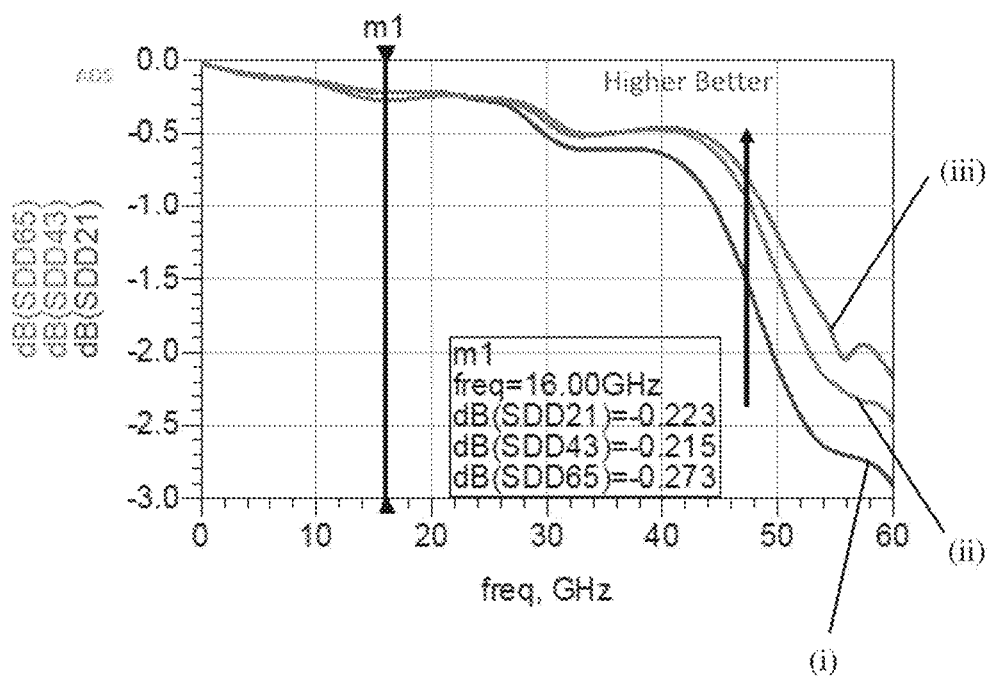
FIG. 1E shows the electrical performance comparison in insertion losses for the PTH vertical interconnects designs of FIG. 1D.

FIG. 1E shows a simulation data of electrical performance comparison in insertion losses for the PTH vertical interconnects designs of FIG. 1D. From the simulated results, it may be seen that the recessed designs of (ii) and (iii) may perform better than that of the conventional design (i). In particular, improvement in electrical performance is much higher after 30 GHz. The improved electrical (signal and/or power integrity) performance may be achieved through a tighter signal PTH to ground PTH coupling, i.e., improved signal current return path (for single-ended bus e.g., DDR memory interface) and a tighter differential signal PTHs coupling, e.g., a universal serial bus (USB) Interface, a peripheral component interconnect express (PCIe) interface or a high speed ethernet interface. Tighter power (Vcc) to ground (Vss) interconnect coupling reduces AC loop inductance for improved power supply delivery or power integrity.

Thus, in one aspect, the first and the second interconnects 108, 112 may be configured to facilitate a differential pair electrical signal, e.g., a universal serial bus Gen4 (USB4.0) Interface operating at ≥20 Gbps, a peripheral component interconnect express Gen5 (PCIe5) interface operating at 32 Gbps or a serial-de-serializer (Serdes) ethernet interface operating at ≥112 Gbps.

In another aspect, the first interconnect 108 may be configured to facilitate a single-ended electrical signal, e.g., a DDR memory interface at ≥5600 MT/s. In the same aspect, the second interconnect 112 may be configured to facilitate a reference voltage, e.g., a ground (Vss) reference voltage, for a reduced crosstalk coupling through a shorter current return path. In yet another aspect, the first interconnect 108 may be configured to facilitate a first reference voltage, e.g., a ground (Vss) reference voltage. In the same aspect, the second interconnect 112 may be configured to facilitate a second reference voltage, e.g., a power supply (Vcc) reference voltage, for an improved power delivery through a shorter AC inductance loop.

In various aspects, the electronic assembly 100 may include one or more devices (not shown) coupled to the first and the second interconnects 108, 112 at the first surface 104. The one or more devices may include semiconductor dies and/or packages, e.g., a central processing unit (CPU), a graphic processing unit (GPU), a memory controller, a field programmable gate array (FPGA), a neural network accelerator, a communication device, e.g., RFIC or a platform controller hub or chipset. In further aspects, the one or more devices may also be coupled to a system board (not shown) through the first and the second interconnects 108, 112 through the second surface 106.

Figure 2A:
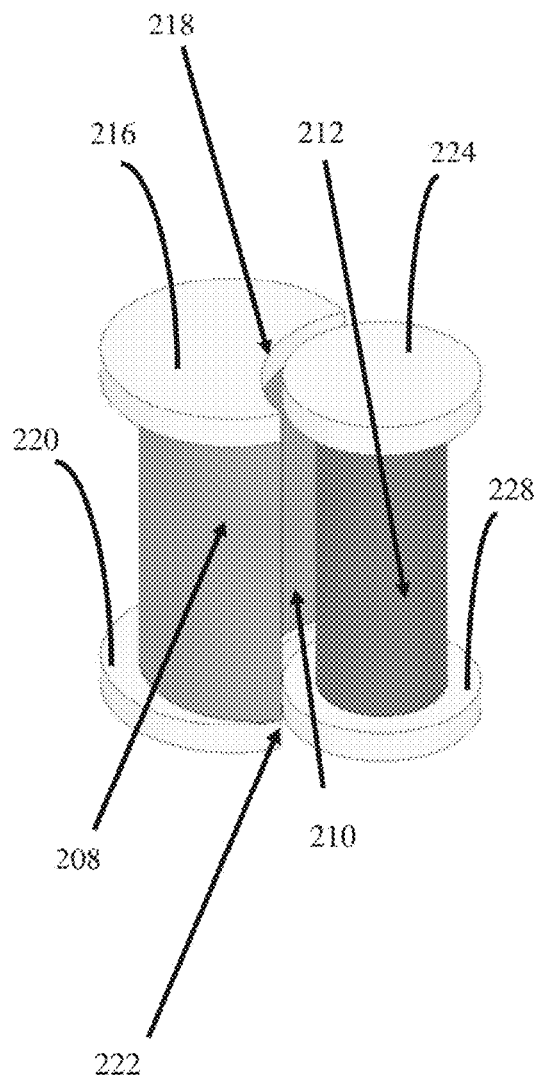
FIG. 2A shows a perspective view of recessed vertical interconnects in an electronic assembly for improved electromagnetic field coupling according to another aspect of the present disclosure.
Figure 2B:
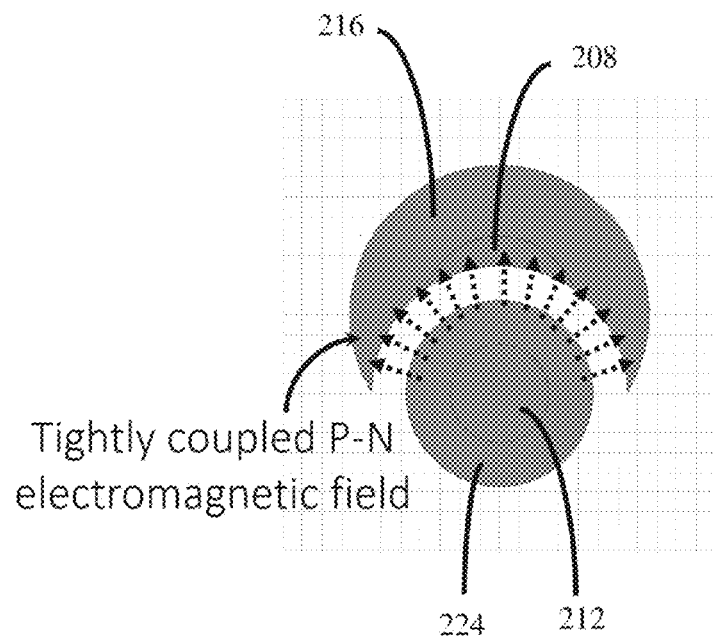
FIG. 2B shows a top view of the electronic assembly according to the aspect as shown in FIG. 2A.
Figure 2C:
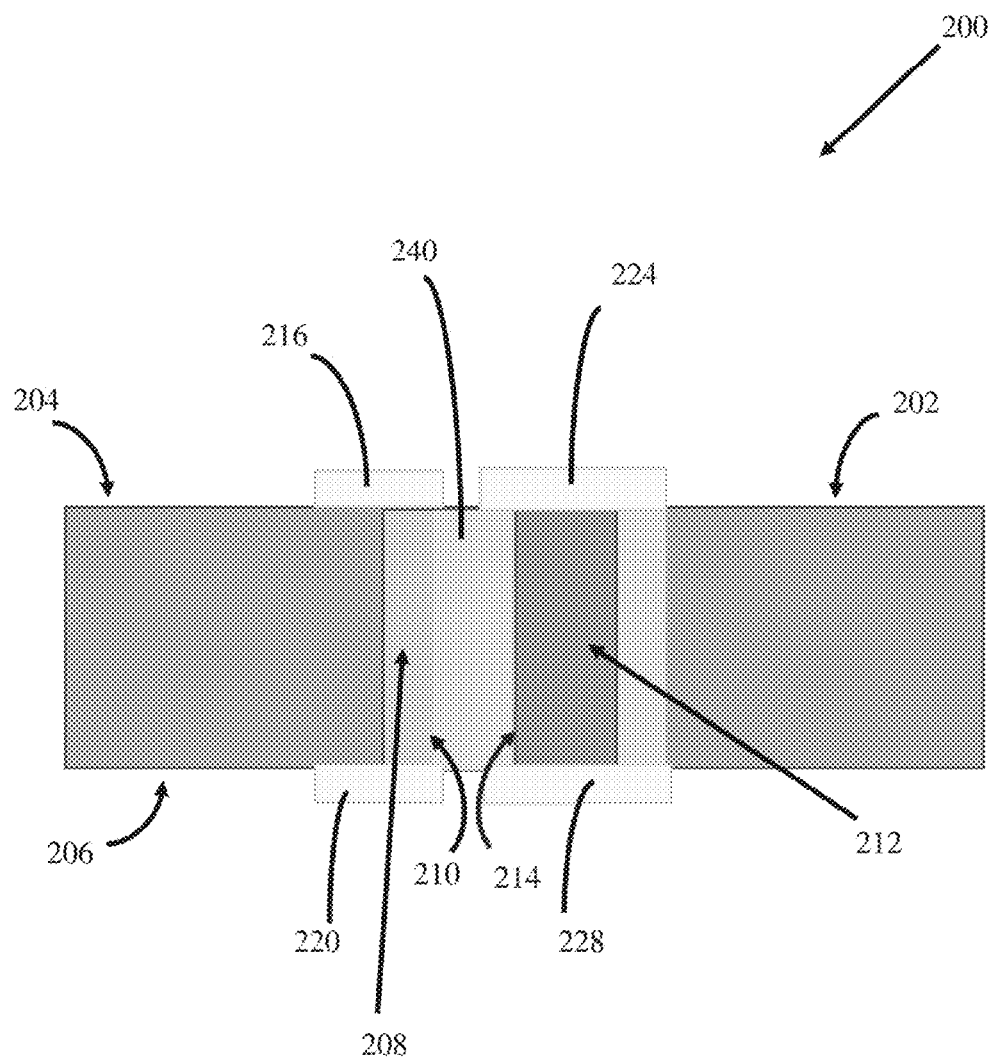
FIG. 2C shows a cross-sectional view of the electronic assembly according to the aspect as shown in FIG. 2A.

FIG. 2A shows a perspective view of recessed vertical interconnects 208, 212 in an electronic assembly 200 for improved electromagnetic field coupling according to another aspect of the present disclosure. FIG. 2B shows a top view of the electronic assembly 200 according to the aspect as shown in FIG. 2A. FIG. 2C shows a cross-sectional view of the electronic assembly 200 according to the aspect as shown in FIG. 2A.

In various aspects, the electronic assembly 200 may include a package substrate 202 having a first surface 204 and an opposing second surface 206. The first surface 204 may be a top surface of the package substrate 202. The second surface 206 may be a bottom surface of the package substrate 202. The first and second surfaces 204, 206 may be substantially horizontal when viewed from a cross-sectional viewpoint. In one aspect, the package substrate 202 may include a bismaleimide-triazine (BT) epoxy layer, a polyimide layer, a glass substrate layer or a silicon substrate layer. In another aspect, the package substrate 202 may include two or more metal layers spaced apart by a dielectric layer.

In various aspects, the package substrate 202 may include a first interconnect 208. The first interconnect 208 may include a first side wall 210 having a length that may extend between the first and second surfaces 204, 206 of the package substrate 202. In one aspect, the first interconnect 208 may extend vertically across the thickness of the package substrate 202. In other words, the first interconnect 202 may be perpendicular to the first and second surfaces 204, 206 to form a first vertical interconnect 208.

In various aspects, the first side wall 210 may include a recessed portion that may extend between the first and second surfaces 204, 206 of the package substrate 202 to form a first recessed side wall 210. In the aspect shown in FIG. 2A and FIG. 2B, the first recessed side wall 210 of the first interconnect 208 may have a crescent-shaped cross section.

In various aspects, the package substrate 202 may include a second interconnect 212. The second interconnect 212 may include a second side wall 214 having a length that may extend between the first and second surfaces 204, 206 of the package substrate 202. In one aspect, the second interconnect 212 may extend vertically across the thickness of the package substrate 202. In other words, the second interconnect 212 may be perpendicular to the first and second surfaces 204, 206 to form a second vertical interconnect 212.

Different from the aspects shown in FIG. 1A, FIG. 1B, and FIG. 1C, the second side wall 214 of the second interconnect 212 may not include a recessed portion.

In various aspects, the first interconnect 208 may be arranged adjacent or close to, but not contacting, the second interconnect 212. In one aspect, the first and the second interconnects 208, 212 may be separated or kept apart by a dielectric or an insulation layer 240 arranged therebetween.

In various aspects, the electronic assembly 200 may further include a first contact pad 216 arranged on the first surface 204 of the package substrate 202. The first contact pad 216 may include a first recessed side 218 coupled to a first terminal of the first interconnect 208 at the first surface 204.

The first recessed side 218 of the first contact pad 216 may include a receding portion that cuts inwards. In various aspects, the first contact pad 216 may include a receding portion having a cross section in a crescent and/or gibbous shape. Other shapes may also be possible. Conveniently though not necessarily, the first recessed side wall 210 and the first recessed side 218 may both have the same shape, e.g., a crescent shape as shown in FIG. 2A and FIG. 2B.

In various aspects, the electronic assembly 200 may further include a subsequent first contact pad 220 arranged on the second surface 206 of the package substrate 202. The subsequent first contact pad 220 may include a subsequent first recessed side 222 coupled to an opposing second terminal of the first interconnect 208 at the second surface 206.

The subsequent first recessed side 222 of the subsequent first contact pad 220 may include a receding portion that cuts inwards. In various aspects, the subsequent first contact pad 220 may include a receding portion having a cross section in a crescent and/or gibbous shape. Other shapes may also be possible. Conveniently though not necessarily, the first recessed side wall 210 and the subsequent first recessed side 222 may both have the same shape, e.g., a crescent shape as shown in FIG. 2A and FIG. 2B.

In one aspect, the first and the subsequent first recessed sides 218, 222 may be aligned with the first recessed side wall 210 of the first interconnect 208. In other words, the respective receding portion of the first recessed side 218 and the first recessed side wall 210 may coincide at the first surface 204 and the respective receding portion of the subsequent first recessed side 222 and the first recessed side wall 210 may coincide at the second surface 206.

In various aspects, the electronic assembly 200 may further include a second contact pad 224 arranged on the first surface 204 of the package substrate 202. The second contact pad 224 may be coupled to a first terminal of the second interconnect 212 at the first surface 204.

In various aspects, the electronic assembly 200 may further include a subsequent second contact pad 228 arranged on the second surface 206 of the package substrate 202. The subsequent second contact pad 228 may be coupled to an opposing second terminal of the second interconnect 212 at the second surface 206.

Different from the aspects shown in FIG. 1A, FIG. 1B, and FIG. 1C, the second and the subsequent second contact pads 224, 228 may not include a recessed side.

In the aspect shown in FIG. 2A and FIG. 2B, the second interconnect 212 may be at least partially encircled by the first recessed side wall 210 of the first interconnect 208. In other words, the second interconnect 212 may be arranged adjacent or close to, but not contacting, first recessed side wall 210 of the first interconnect 208.

Similar to the aspects shown in FIG. 1A, FIG. 1B, and FIG. 1C, the electronic assembly 200 may include a plurality of first metal traces and/or planes (not shown) coupled to the first and the second contact pads 216, 224. In further aspects, the electronic assembly 200 may also include a plurality of second metal traces and/or planes (not shown) coupled to the subsequent first and the subsequent second contact pads 220, 228.

In one aspect shown in FIG. 2B, the first and the second interconnects 208, 212 may be configured to facilitate a differential pair electrical signal, e.g., a universal serial bus Gen4 (USB4.0) interface operating at ≥20 Gbps, a peripheral component interconnect express Gen5 (PCIe5) interface operating at 32 Gbps or a serial-de-serializer (Serdes) ethernet interface operating at ≥112 Gbps. For example, the first interconnect 208 may carry a P-signal while the second interconnect 212 may carry a complementary N-signal. When an electrical signal travels through the first and second interconnects 208, 212, such an arrangement may provide less signal distortions and/or coupling noises from adjacent signals, thereby improving the electrical integrity through a tighter coupling.

In another aspect, the second interconnect 212 may be configured to facilitate a single-ended electrical signal, e.g., a DDR memory interface at ≥5600 MT/s. In the same aspect, the first interconnect 208 may be configured to facilitate a reference voltage, e.g., a ground (Vss) reference voltage, for a reduced crosstalk coupling through a shorter current return path. In yet another aspect, the first interconnect 208 may be configured to facilitate a first reference voltage, e.g., a power supply (Vcc) reference voltage. In the same aspect, the second interconnect 212 may be configured to facilitate a second reference voltage, e.g., a ground (Vss) reference voltage, for an improved power delivery through a shorter AC inductance loop.

In various aspects, the electronic assembly 200 may include one or more devices (not shown) coupled to the first and the second interconnects 208, 212 at the first surface 204. The one or more devices may include semiconductor dies and/or packages, e.g., a central processing unit (CPU), a graphic processing unit (GPU), a memory controller, a field programmable gate array (FPGA), a neural network accelerator, a communication device, e.g., RFIC or a platform controller hub or chipset. In further aspects, the one or more devices may also be coupled to a system board (not shown) through the first and the second interconnects 208, 212 through the second surface 206.

Figure 3A:
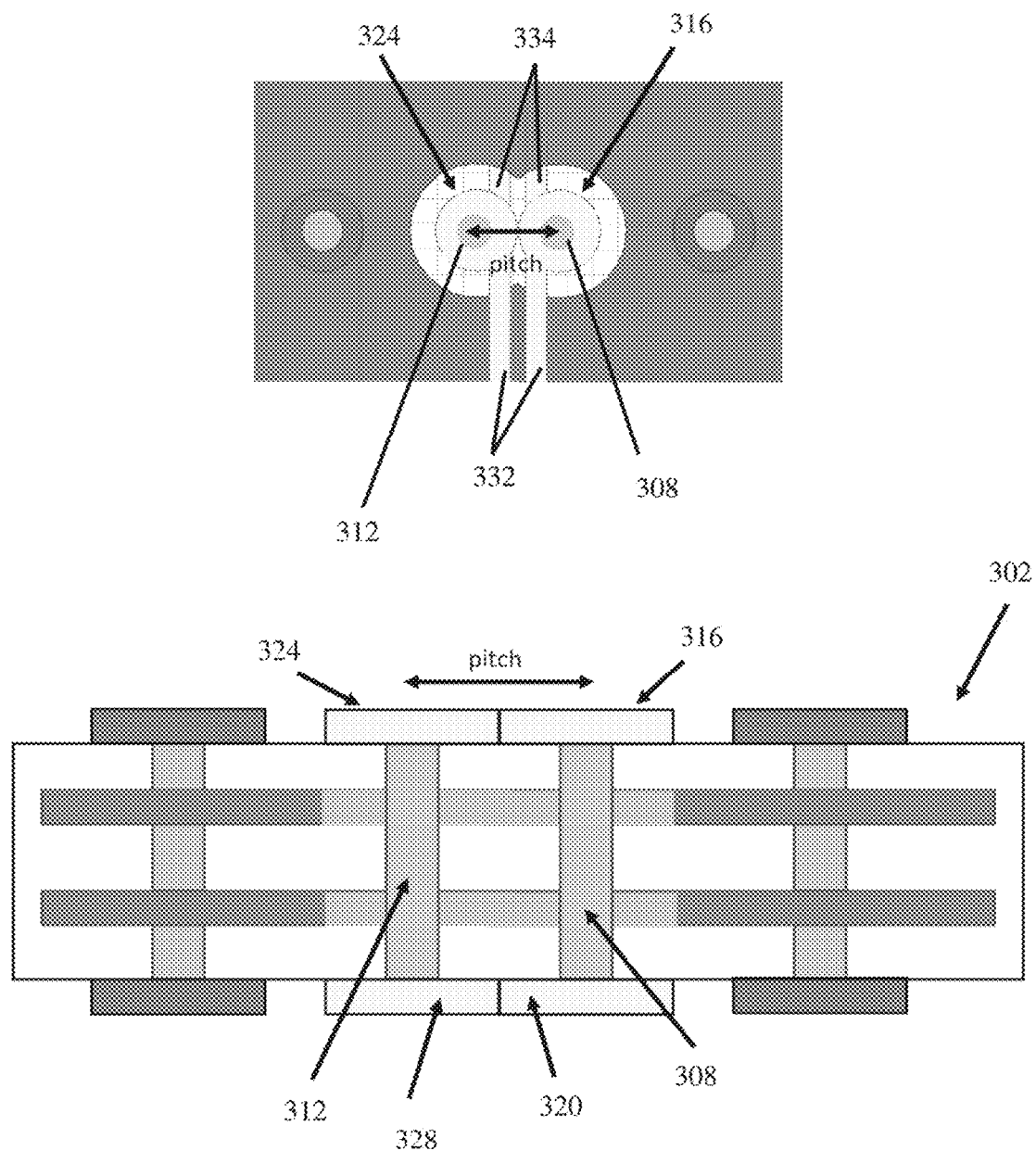
FIGS. 3A through 3B show views directed to an exemplary simplified process flow for manufacturing the recessed vertical interconnects according to an aspect that is generally similar to that shown in FIG. 1A of the present disclosure.
Figure 3B:
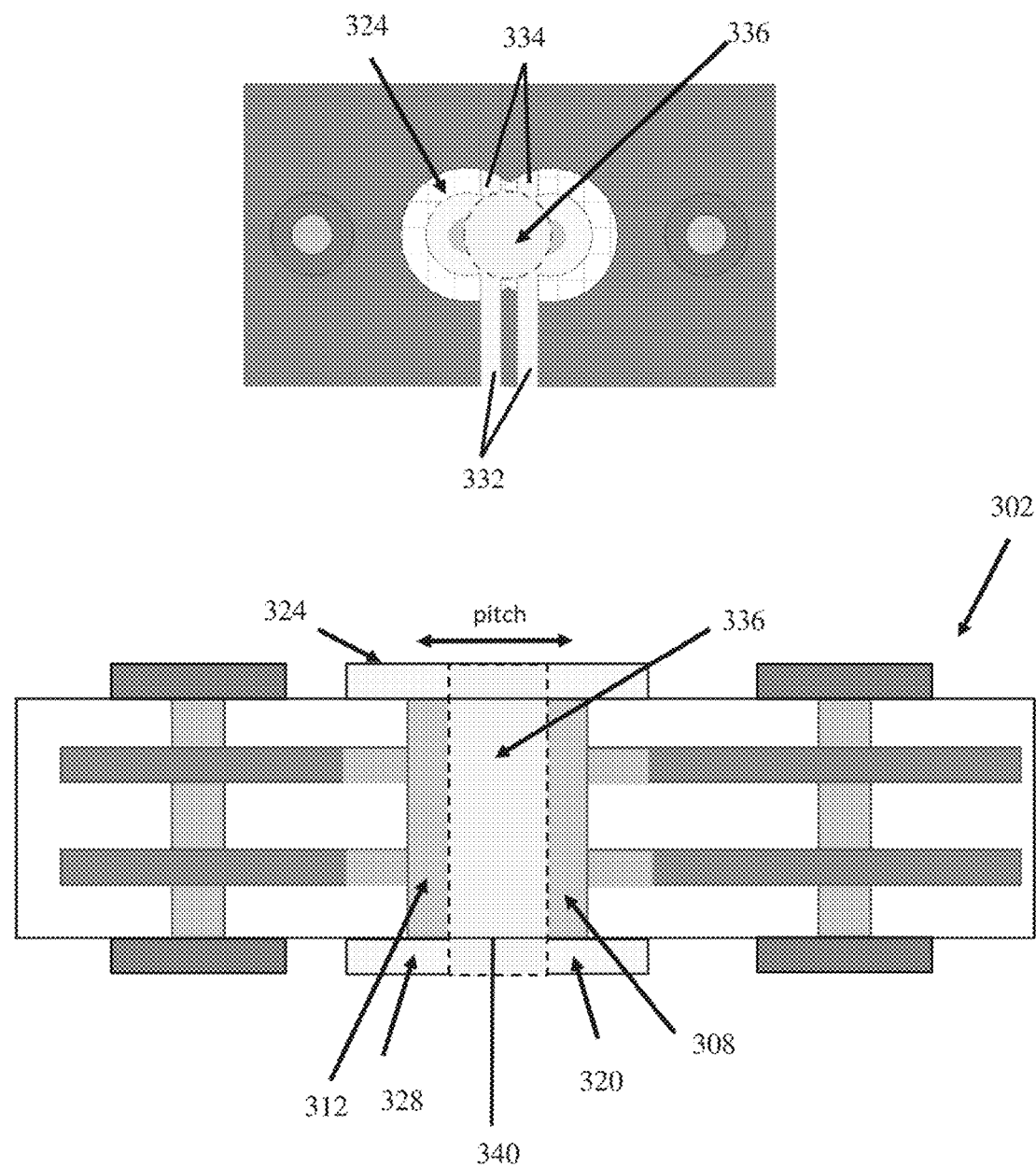

FIGS. 3A through 3B show views directed to an exemplary simplified process flow for manufacturing the recessed vertical interconnects 308, 312 according to an aspect that is generally similar to that shown in FIG. 1A of the present disclosure. The order of assembly process operation may be interchangeable.

FIG. 3A shows a top view (top) and a cross-sectional view (bottom) of a first and a second interconnects 308, 312 arranged adjacent each other in a package substrate or a printed circuit board 302. The first interconnect 308 may include a first contact pad 316 and a subsequent first contact pad 320 coupled thereto as described in earlier paragraphs. Similarly, the second interconnect 312 may include a second contact pad 324 and a subsequent second contact pad 328 coupled thereto. A plurality of metal traces and/or planes 332, 334 may also be coupled to the respective contact pads 316, 320, 324, 328. Conventional techniques may be employed, such as but not limited to, a photolithography, an etching, and a plating process.

As may be seen in FIG. 3A, the pitch between the first and second interconnects 308, 312 may be smaller than that between interconnects of a conventional setup by arranging the presently disclosed contact pads as closely as possible. The first and second contact pads 316, 324 may even be arranged to contact each other for further pitch reduction.

FIG. 3B shows a top view (top) and a cross-sectional view (bottom) of removal of an overlap contact pad section through, e.g., a mechanical or a laser drilling process. As shown in this figure, portions of the first, the subsequent first, the second, and the subsequent second contact pads 316, 320, 324, 328 may be removed. A drilled through hole section (or recess opening) 336 may thus be formed in the package substrate or the printed circuit board 302. An insulation or a dielectric layer 340, e.g., an epoxy polymer resin layer, may be deposited within the recess opening 336 through, e.g., a plugging, a printing, a spraying, a coating or a dispensing process, followed by a subsequent solder resist deposition or lamination on top and bottom surfaces of the package substrate or the printed circuit board 302.

FIGS. 4A through 4G show views directed to an exemplary simplified process flow for manufacturing the recessed vertical interconnects 408, 412 according to an aspect that is generally similar to that shown in FIG. 2A of the present disclosure. The order of assembly process operation may be interchangeable.

Figure 4A:
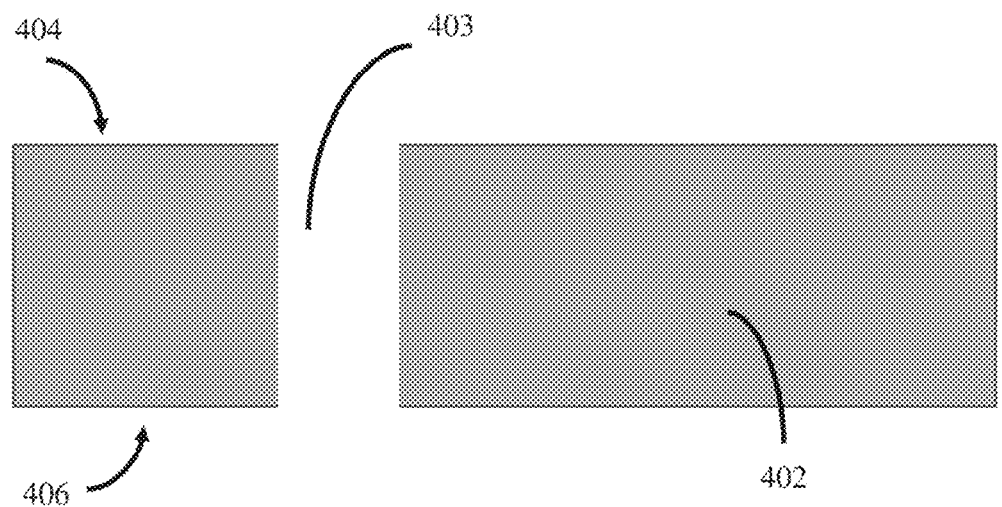
FIGS. 4A through 4G show views directed to an exemplary simplified process flow for manufacturing the recessed vertical interconnects according to an aspect that is generally similar to that shown in FIG. 2A of the present disclosure.

FIG. 4A shows a cross-sectional view of a package substrate core layer 402 having a first and a second surfaces 404, 406. A first substrate core opening 403 may be formed by, e.g., a mechanical or a laser drilling process.

Figure 4B:
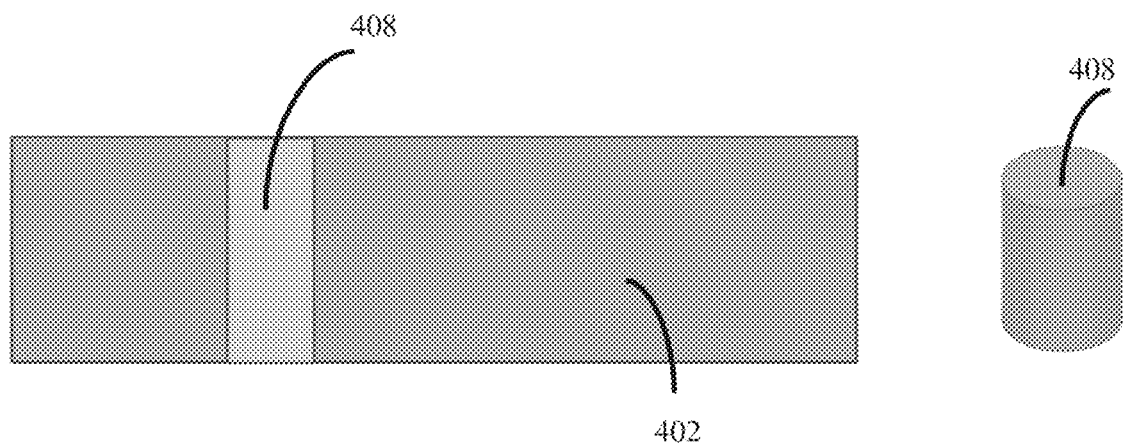

FIG. 4B shows formation of a first interconnect 408 in the first substrate core opening 403. The formation may be performed through, e.g., an electroplating or a solder printing process. The left side of FIG. 4B shows a cross-sectional view of the first interconnect 408 arranged in the package substrate core layer 402. The right side of FIG. 4B shows a perspective view of the first interconnect 408. In one aspect, the first interconnect 408 may be a cylinder.

Figure 4C:
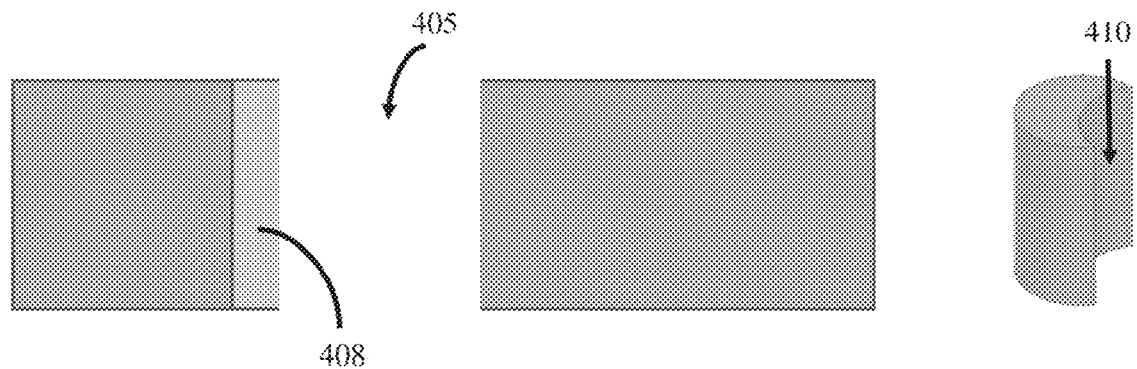

FIG. 4C shows formation of a second substrate core opening 405 in the package substrate core layer 402 through, e.g., a mechanical or a laser drilling process. During the drilling process, a portion of the first interconnect 408 may also be cut out to form a first recessed side wall 410 on the first interconnect 408. The left side of FIG. 4C shows a cross-sectional view of the first interconnect 408 including the first recessed side wall 410 and second substrate core opening 405 in the package substrate core layer 402. The right side of FIG. 4C shows a perspective view of the first interconnect 408 including the first recessed side wall 410. In one aspect, the first recessed side wall 410 may include a crescent-shaped cross section.

Figure 4D:
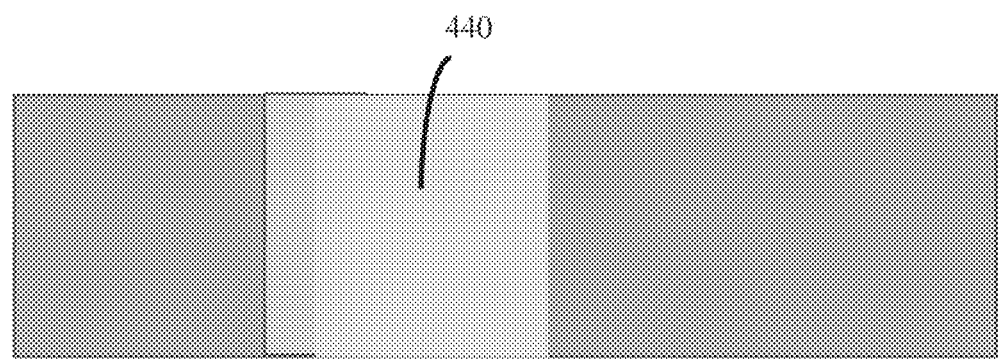

FIG. 4D shows a cross-sectional view of the package substrate core layer filled with a dielectric or an insulation layer 440, e.g., an epoxy polymer resin layer, in the second substrate core opening 405. The filling process may be carried out by e.g., a printing, a coating, a spraying, a dispensing, a plugging process.

Figure 4E:
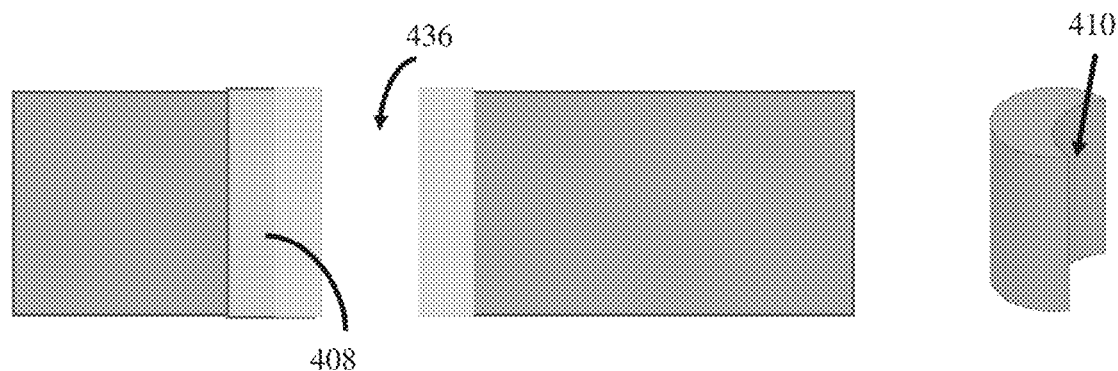

FIG. 4E shows formation of a dielectric opening 436 through e.g., a mechanical or a laser drilling process. The dielectric opening 436 may be formed by drilling a portion of the dielectric layer 440. The left side of FIG. 4E shows a cross-sectional view of the first interconnect 408 including the first recessed side wall 410 and the dielectric opening 436 in the package substrate core layer 402. The right side of FIG. 4E shows a perspective view of the first interconnect 408 including the first recessed side wall 410.

Figure 4F:
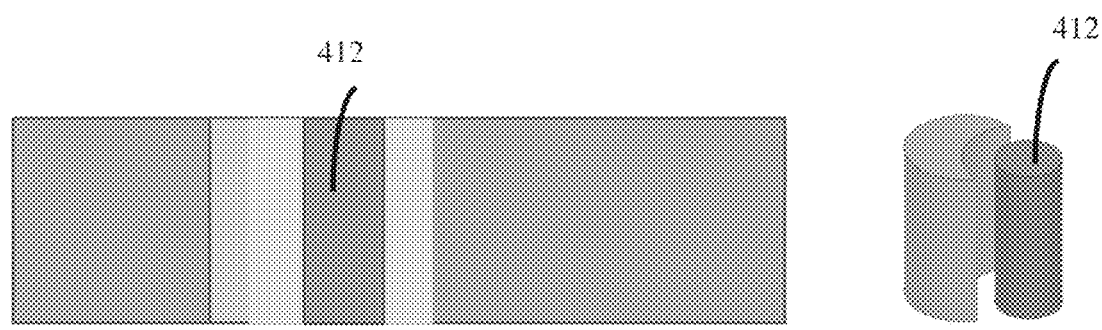

FIG. 4F shows formation of a second interconnect 412 in the dielectric opening 436 through e.g., an electroplating or a solder printing process. The left side of FIG. 4F shows a cross-sectional view of the first and second interconnects 408, 412 arranged in the package substrate core layer 402. The right side of FIG. 4F shows a perspective view of the first and second interconnects 408, 412 arranged adjacent to each other. In one aspect, the second interconnect 412 may be a cylinder. The second interconnect 412 may be at least partially encircled by the first recessed side wall 410 of the first interconnect 408. In other words, the second interconnect 412 may be arranged to face the first recessed side wall 410 of the first interconnect 408. In one aspect, the first and the second surfaces 404, 406 may be polished through e.g., a mechanical grinding process after the formation of the second interconnect 412.

Figure 4G:
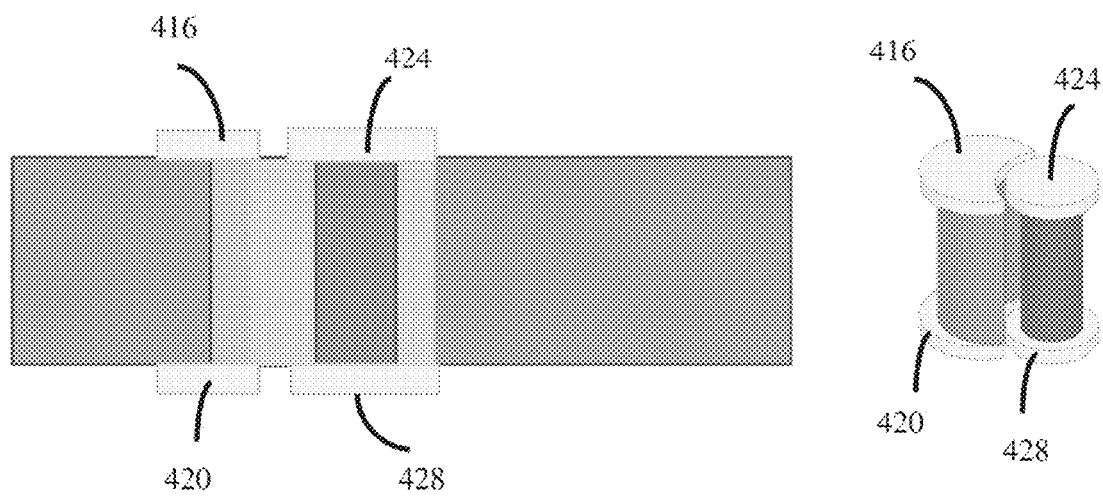

FIG. 4G shows formation of contact pads 416, 420, 424, 428 on the package substrate core layer 402. A first and a second contact pads 416, 424 may be coupled to the first and the second interconnects 408, 412, respectively, on the first surface 404 through e.g., an electroplating, an etching process. A subsequent first and a subsequent second contact pads 420, 428 may be coupled to the first and the second interconnects 408, 412, respectively, on the second surface 406 through e.g., an electroplating, an etching process. The left side of FIG. 4G shows a cross-sectional view of the first and second interconnects 408, 412 including the respective contact pads 416, 420, 424, 428. The right side of FIG. 4G shows a perspective view of the first and second interconnects 408, 412 including the respective contact pads 416, 420, 424, 428. In one aspect, a plurality of metal vias, traces and/or planes (not shown) may be coupled to the respective contact pads 416, 420, 424, 428 through conventional techniques, such as but not limited to, a lamination, a drilling, a plating, a photolithography and an etching process.

Figure 5:
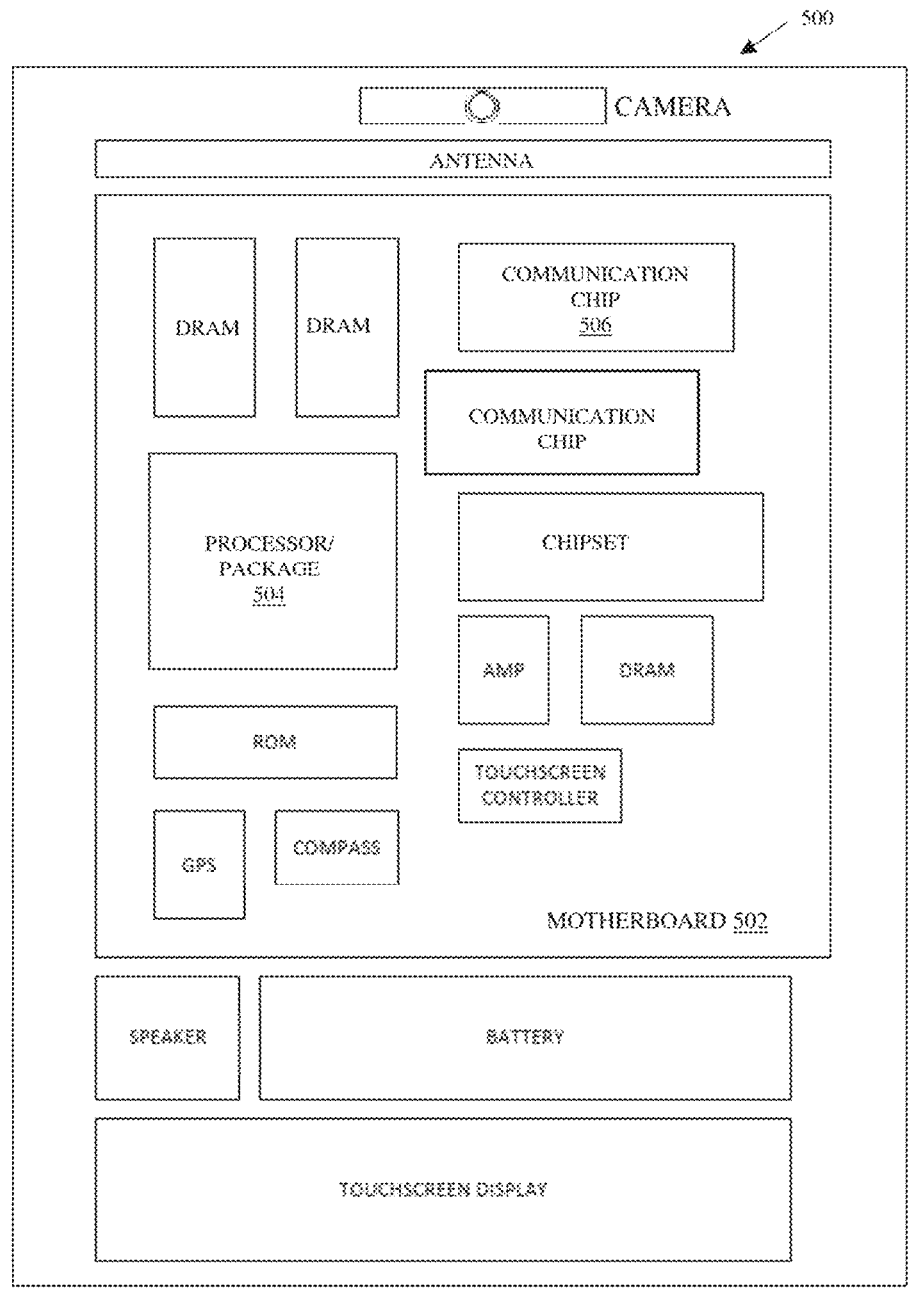
FIG. 5 shows an illustration of a computing device that includes an electronic assembly according to a further aspect of the present disclosure.

Aspects of the present disclosure may be implemented into a system using any suitable hardware and/or software. FIG. 5 schematically illustrates a computing device 500 that may include a semiconductor package as described herein, in accordance with some aspects. The computing device 500 may house a board such as a motherboard 502. The motherboard 502 may include a number of components, including but not limited to a processor 504 and at least one communication chip 506. The processor 504, which may have an electronic assembly according to the present disclosure, may be physically and electrically coupled to the motherboard 502. In some implementations, the at least one communication chip 506 may also be physically and electrically coupled to the motherboard 502. In further implementations, the communication chip 506 may be part of the processor 504.

Depending on its applications, computing device 500 may include other components that may or may not be physically and electrically coupled to the motherboard 502. These other components may include, but are not limited to, volatile memory (e.g. DRAM), non-volatile memory (e.g. ROM), flash memory, a graphics processor, a digital signal processor, a cryptoprocessor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 506 may enable wireless communications for the transfer of data to and from the computing device 500. The term "wireless" and its derivatives may be used to describe circuits, devices, systems, methods, techniques, communications channels, etc. that may communicate data through the use of modulated electromagnetic radiation through a non-solid medium. The term does not imply that the associated devices do not contain any wires, although in some aspects they might not. The communication chip 506 may implement any of a number of wireless standards or protocols, including but not limited to Institute for Electrical and Electronic Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2", etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 506 may also operate in accordance with a Global System for Mobile Communication (GSM), General Packet Radio Service (GPRS), Universal Mobile Telecommunications System (UNITS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other aspects.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

In various implementations, the computing device 500 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In an aspect, the computing device 500 may be a mobile computing device. In further implementations, the computing device 500 may be any other electronic device that processes data.

Figure 6:
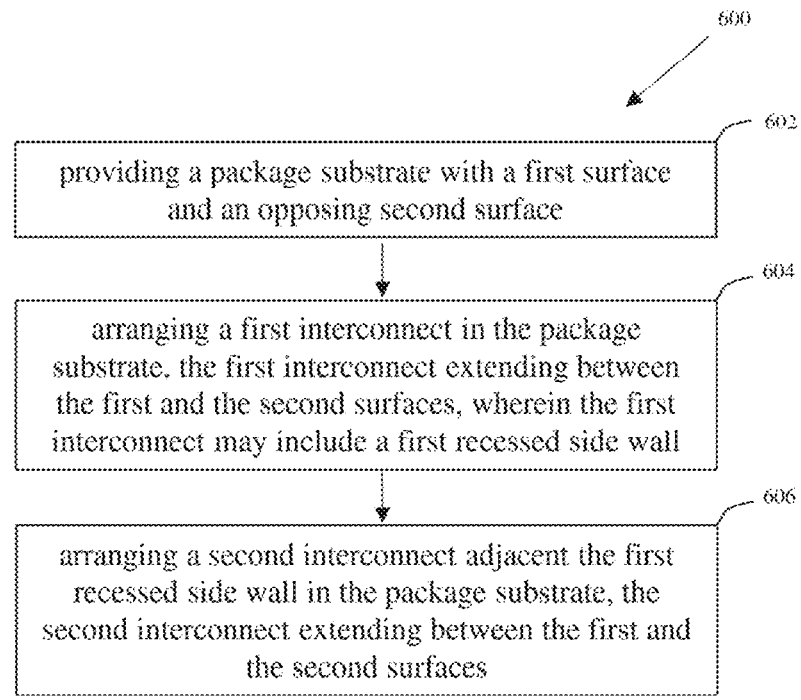
FIG. 6 shows a flow chart illustrating a method for forming an electronic assembly according to an aspect of the present disclosure.

FIG. 6 shows a flow chart illustrating a method 600 of forming an electronic assembly according to an aspect of the present disclosure.

As shown in FIG. 6, at operation 602, the method 600 of forming an electronic assembly may include providing a package substrate with a first surface and an opposing second surface.

At operation 604, the method may include arranging a first interconnect in the package substrate, the first interconnect extending between the first and the second surfaces, wherein the first interconnect may include a first recessed side wall.

At operation 606, the method may include arranging a second interconnect adjacent the first recessed side wall in the package substrate, the second interconnect extending between the first and the second surfaces.

It will be understood that the above operations described above relating to FIG. 6 are not limited to this particular order. Any suitable, modified order of operations may be used.

EXAMPLES

Example 1 may include an electronic assembly including a package substrate with a first surface and an opposing second surface; a first interconnect in the package substrate and may extend between the first and the second surfaces; and a second interconnect in the package substrate and may extend between the first and the second surfaces, wherein the first interconnect may include a first recessed side wall and the second interconnect may be arranged adjacent the first recessed side wall.

Example 2 may include the electronic assembly of example 1 and/or any other example disclosed herein, further including a first contact pad including a first recessed side coupled to a first terminal of the first interconnect, and a subsequent first contact pad including a subsequent first recessed side coupled to an opposing second terminal of the first interconnect, wherein the first and the subsequent first recessed sides may be aligned with the first recessed side wall.

Example 3 may include the electronic assembly of example 1 and/or any other example disclosed herein, wherein the second interconnect may be at least partially encircled by the first recessed side wall.

Example 4 may include the electronic assembly of example 1 and/or any other example disclosed herein, wherein the second interconnect may further include a second recessed side wall extending in parallel with the first recessed side wall between the first and the second surfaces.

Example 5 may include the electronic assembly of example 4 and/or any other example disclosed herein, wherein the first and the second recessed sides may face each other.

Example 6 may include the electronic assembly of example 4 and/or any other example disclosed herein, further including a second contact pad including a second recessed side coupled to a first terminal of the second interconnect, and a subsequent second contact pad including a subsequent second recessed side coupled to an opposing second terminal of the second interconnect, wherein the second and the subsequent second recessed sides may be aligned with the second recessed side wall.

Example 7 may include the electronic assembly of example 6 and/or any other example disclosed herein, further including a plurality of first metal traces or planes coupled to the first and the second contact pads, and a plurality of second metal traces or planes coupled to the subsequent first and the subsequent second contact pads.

Example 8 may include the electronic assembly of example 1 and/or any other example disclosed herein, further including one or more devices coupled to the first and the second interconnects at the first surface.

Example 9 may include the electronic assembly of example 1 and/or any other example disclosed herein, wherein the first and second interconnects may be configured to facilitate a differential pair electrical signal.

Example 10 may include the electronic assembly of example 1 and/or any other example disclosed herein, wherein the first interconnect may be configured to facilitate a reference voltage and the second interconnect is configured to facilitate a single-ended electrical signal.

Example 11 may include a computing device including a communication chip; and an electronic assembly coupled to the communication chip, the electronic assembly may include: a package substrate with a first surface and an opposing second surface; a first interconnect in the package substrate and may extend between the first and the second surfaces; and a second interconnect in the package substrate and may extend between the first and the second surfaces; wherein the first interconnect may include a first recessed side wall and the second interconnect may be arranged adjacent the first recessed side wall.

Example 12 may include the computing device of example 11 and/or any other example disclosed herein, further including a first contact pad including a first recessed side coupled to a first terminal of the first interconnect, and a subsequent first contact pad including a subsequent first recessed side coupled to an opposing second terminal of the first interconnect, wherein the first and the subsequent first recessed sides may be aligned with the first recessed side wall.

Example 13 may include a computing device of example 11 and/or any other example disclosed herein, wherein the second interconnect may be at least partially encircled by the first recessed side wall.

Example 14 may include the computing device of example 11 and/or any other example disclosed herein, wherein the second interconnect may further include a second recessed side wall extending in parallel with the first recessed side wall between the first and the second surfaces.

Example 15 may include the computing device of example 14 and/or any other example disclosed herein, wherein the first and the second recessed sides may face each other.

Example 16 may include the computing device of example 14 and/or any other example disclosed herein, further including a second contact pad including a second recessed side coupled to a first terminal of the second interconnect, and a subsequent second contact pad including a subsequent second recessed side coupled to an opposing second terminal of the second interconnect, wherein the second and the subsequent second recessed sides may be aligned with the second recessed side wall.

Example 17 may include a method including providing a package substrate with a first surface and an opposing second surface; arranging a first interconnect in the package substrate, the first interconnect extending between the first and the second surfaces, wherein the first interconnect may include a first recessed side wall; and arranging a second interconnect adjacent the first recessed side wall in the package substrate, the second interconnect extending between the first and the second surfaces.

Example 18 may include the method of example 17 and/or any other example disclosed herein, further including: coupling a first contact pad including a first recessed side to a first terminal of the first interconnect; coupling a subsequent first contact pad including a subsequent first recessed side to an opposing second terminal of the first interconnect; and aligning the first and the subsequent first recessed sides with the first recessed side wall.

Example 19 may include the method of example 17 and/or any other example disclosed herein, further including at least partially encircling the second interconnect by the first recessed side wall.

Example 20 may include the method of example 17 and/or any other example disclosed herein, further including: forming in the second interconnect a second recessed side wall extending in parallel with the first recessed side wall between the first and the second surfaces; coupling a second contact pad including a second recessed side to a first terminal of the second interconnect; coupling a subsequent second contact pad including a subsequent second recessed side to an opposing second terminal of the second interconnect; and aligning the second and the subsequent second recessed sides with the second recessed side wall.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") used herein may be understood as electrically coupled or as mechanically coupled, e.g., attached or fixed or mounted, or just in contact without any fixation, and it will be understood that both direct coupling and indirect coupling (in other words, coupling without direct contact) may be provided.

While the present disclosure has been particularly shown and described with reference to specific aspects, it should be understood by persons skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:

1. An electronic assembly comprising:
   a package substrate with a first surface and an opposing second surface;
   a first interconnect disposed in the package substrate and extending between the first and the second surfaces;
   a second interconnect disposed in the package substrate and extending between the first and the second surfaces;
   a first contact pad comprising a first recessed side coupled to a first terminal of the first interconnect; and
   a subsequent first contact pad comprising a subsequent first recessed side coupled to an opposing second terminal of the first interconnect,
   wherein the first interconnect comprises a first recessed side wall and the second interconnect is arranged adjacent the first recessed side wall, wherein the first and the subsequent first recessed sides are aligned with the first recessed side wall.

2. The electronic assembly of claim 1, wherein the second interconnect is at least partially encircled by the first recessed side wall.

3. The electronic assembly of claim 1, wherein the second interconnect further comprises a second recessed side wall extending in parallel with the first recessed side wall between the first and the second surfaces.

4. The electronic assembly of claim 3, wherein the first and the second recessed sides face each other.

5. The electronic assembly of claim 3, further comprising a second contact pad comprising a second recessed side coupled to a first terminal of the second interconnect, and a subsequent second contact pad comprising a subsequent second recessed side coupled to an opposing second terminal of the second interconnect, wherein the second and the subsequent second recessed sides are aligned with the second recessed side wall.

6. The electronic assembly of claim 5, further comprising a plurality of first metal traces or planes coupled to the first and the second contact pads, and a plurality of second metal traces or planes coupled to the subsequent first and the subsequent second contact pads.

7. The electronic assembly of claim 1, wherein the first and second interconnects are configured to facilitate a differential pair electrical signal.

8. The electronic assembly of claim 1, wherein the first interconnect is configured to facilitate a reference voltage and the second interconnect is configured to facilitate a single-ended electrical signal.

9. A computing device comprising:
   a communication chip; and
   an electronic assembly coupled to the communication chip, the electronic assembly comprising:
     a package substrate with a first surface and an opposing second surface;
     a first interconnect disposed in the package substrate and extending between the first and the second surfaces;
     a second interconnect disposed in the package substrate and extending between the first and the second surfaces;
     a first contact pad comprising a first recessed side coupled to a first terminal of the first interconnect; and
     a subsequent first contact pad comprising a subsequent first recessed side coupled to an opposing second terminal of the first interconnect,
     wherein the first interconnect comprises a first recessed side wall and the second interconnect is arranged adjacent the first recessed side wall, wherein the first and the subsequent first recessed sides are aligned with the first recessed side wall.

10. The computing device of claim 9, wherein the second interconnect is at least partially encircled by the first recessed side wall.

11. The computing device of claim 9, wherein the second interconnect further comprises a second recessed side wall extending in parallel with the first recessed side wall between the first and the second surfaces.

12. The computing device of claim 11, wherein the first and the second recessed sides face each other.

13. The computing device of claim 11, further comprising a second contact pad comprising a second recessed side coupled to a first terminal of the second interconnect, and a subsequent second contact pad comprising a subsequent second recessed side coupled to an opposing second terminal of the second interconnect, wherein the second and the subsequent second recessed sides are aligned with the second recessed side wall.

14. A method comprising:
providing a package substrate with a first surface and an opposing second surface;
arranging a first interconnect in the package substrate, the first interconnect extending between the first and the second surfaces, wherein the first interconnect comprises a first recessed side wall;
arranging a second interconnect adjacent the first recessed side wall in the package substrate, the second interconnect extending between the first and the second surfaces;
coupling a first contact pad comprising a first recessed side to a first terminal of the first interconnect;
coupling a subsequent first contact pad comprising a subsequent first recessed side to an opposing second terminal of the first interconnect; and
aligning the first and the subsequent first recessed sides with the first recessed side wall.

15. The method of claim 14, further comprising at least partially encircling the second interconnect by the first recessed side wall.

16. The method of claim 14, further comprising:
forming in the second interconnect a second recessed side wall extending in parallel with the first recessed side wall between the first and the second surfaces;
coupling a second contact pad comprising a second recessed side to a first terminal of the second interconnect;
coupling a subsequent second contact pad comprising a subsequent second recessed side to an opposing second terminal of the second interconnect; and
aligning the second and the subsequent second recessed sides with the second recessed side wall.

* * * * *